United States Patent
Lee et al.

(10) Patent No.: US 9,292,030 B2
(45) Date of Patent: *Mar. 22, 2016

(54) ELECTRONIC CIRCUIT HAVING BAND-GAP REFERENCE CIRCUIT AND START-UP CIRCUIT, AND METHOD OF STARTING-UP BAND-GAP REFERENCE CIRCUIT

(71) Applicant: TAIWAN SEMICONDUCTOR MANUFACTURING COMPANY, LTD., Hsinchu (TW)

(72) Inventors: Chia-Fu Lee, Hsinchu (TW); Chih-Feng Li, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/446,745

(22) Filed: Jul. 30, 2014

(65) Prior Publication Data
US 2014/0340070 A1    Nov. 20, 2014

Related U.S. Application Data

(63) Continuation of application No. 13/249,571, filed on Sep. 30, 2011, now Pat. No. 8,816,670.

(51) Int. Cl.
*G05F 3/16* (2006.01)
*G05F 3/30* (2006.01)
*H03F 3/45* (2006.01)
*H03F 3/72* (2006.01)
*G05F 3/26* (2006.01)

(52) U.S. Cl.
CPC .. *G05F 3/30* (2013.01); *G05F 3/26* (2013.01); *H03F 3/45928* (2013.01); *H03F 3/72* (2013.01); *H03F 2203/45528* (2013.01)

(58) Field of Classification Search
USPC ......... 323/311, 312, 313, 314, 315, 316, 317; 327/538, 539, 540, 541
See application file for complete search history.

(56) References Cited

U.S. PATENT DOCUMENTS

| | | | |
|---|---|---|---|
| 6,992,472 B2 * | 1/2006 | Schimper | 323/313 |
| 8,283,974 B2 * | 10/2012 | Chu et al. | 327/539 |
| 2007/0052405 A1 | 3/2007 | Mochizuki et al. | |
| 2011/0025291 A1 | 2/2011 | Lee et al. | |

* cited by examiner

*Primary Examiner* — Nguyen Tran
(74) *Attorney, Agent, or Firm* — Hauptman Ham, LLP

(57) ABSTRACT

A circuit includes a band-gap reference circuit and a start-up circuit. The band-gap reference circuit includes an operational amplifier, a first current path between a power supply node and a reference node, a second current path between the power supply node and the reference node, and a feedback path between an output of the operational amplifier and the first and second current paths. A first input of the operational amplifier is coupled to the first current path, and a second input of the operational amplifier is coupled to the second current path. The start-up circuit includes a current source and at least one switch coupled between the current source and the band-gap reference circuit. The at least one switch is configured to electrically couple the current source with the first and second current paths during a start-up phase.

20 Claims, 5 Drawing Sheets

ELECTRONIC CIRCUIT HAVING BAND-GAP REFERENCE CIRCUIT AND START-UP CIRCUIT, AND METHOD OF STARTING-UP BAND-GAP REFERENCE CIRCUIT

PRIORITY CLAIM

The present application is a continuation of U.S. application Ser. No. 13/249,571, filed Sep. 30, 2011, the disclosure of which is incorporated herein by reference in its entirety.

TECHNICAL FIELD

The present disclosure relates to an electronic circuit having a band-gap reference circuit and a start-up circuit, and also to a method of starting-up a band-gap reference circuit.

BACKGROUND

Band-gap reference circuits are widely used for providing substantially constant reference voltages in various analog and integrated circuit devices. In many applications, band-gap reference circuits are configured to generate constant reference voltages over an intended temperature range and/or despite some variations in the power supply voltage.

A characteristic of a band-gap reference circuit is its start-up phase, during which a voltage at an output of the band-gap reference circuit changes from a standby level in a standby state to a stable reference voltage level in an operating state. Generally, a start-up circuit is provided and enabled for starting-up the band-gap reference circuit during the start-up phase. After the start-up phase, i.e., when the voltage at the output of the band-gap reference circuit has settled at the stable reference voltage level, the start-up circuit is disabled.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
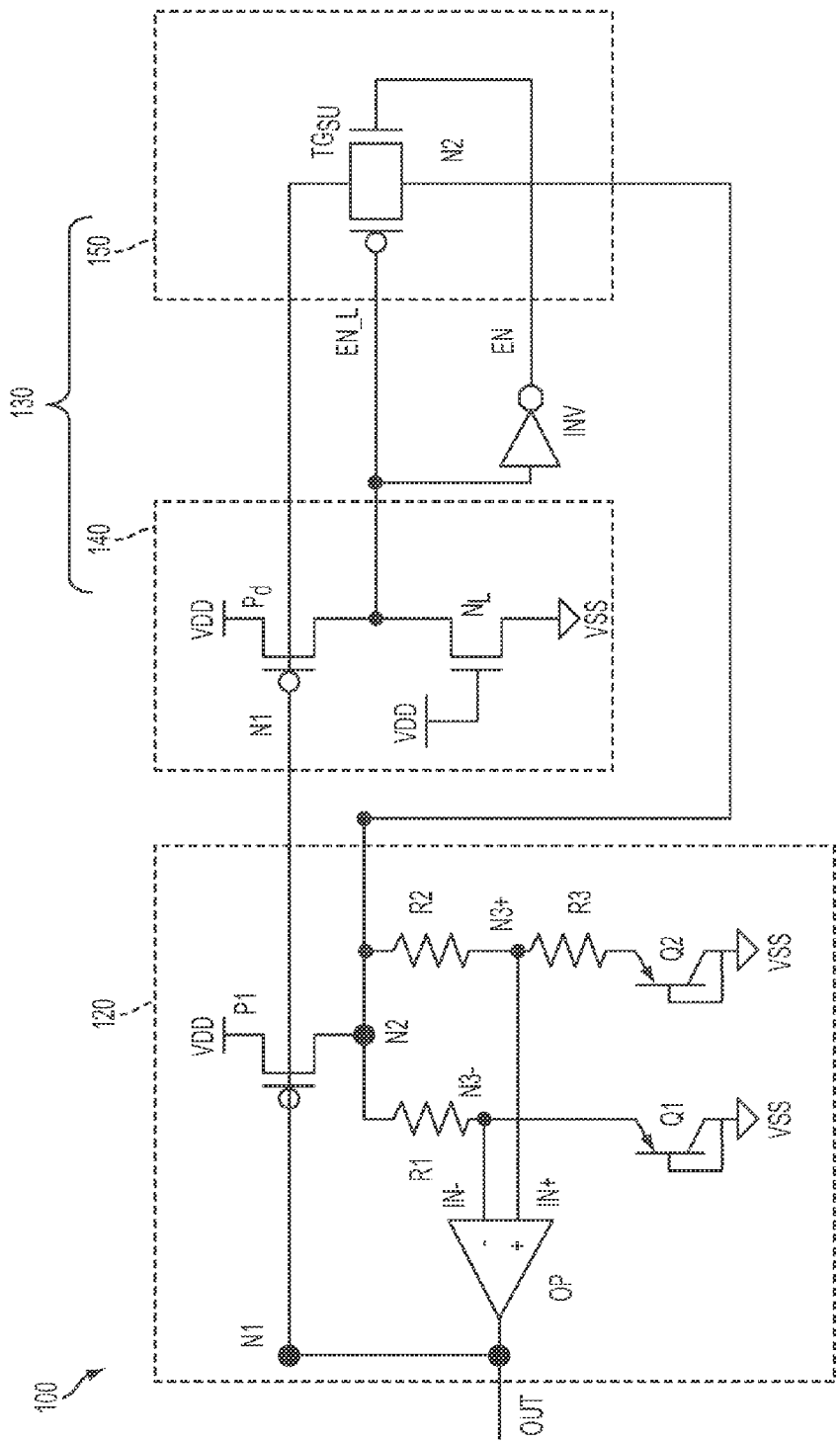
FIG. 1 is a schematic circuit diagram of an electronic circuit having a band-gap reference circuit and a start-up circuit.

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

FIG. 1 is a schematic circuit diagram of an electronic circuit 100 having a band-gap reference circuit 120 connected with a start-up circuit 130.

The band-gap reference circuit 120 includes an operational amplifier OP, a p-type metal-oxide-semiconductor (PMOS) transistor P1, a first node N1 and a second node N2. The operational amplifier OP has an inverting input IN−, a non-inverting input IN+, and an output OUT. The output OUT is coupled to the first node N1. The PMOS transistor P1 has a gate coupled to the first node N1, a source coupled to receive a power supply voltage VDD, and a drain coupled to the second node N2. A resistor R1 and a transistor Q1 are connected in series between the second node N2 and the ground VSS. The inverting input IN− is coupled to a first middle point N3− between the resistor R1 and the transistor Q1. The transistor Q1, e.g., a bipolar transistor, is configured to function as a diode. Resistors R2 and R3 and a transistor Q2 are connected in series between the second node N2 and the ground VSS. The non-inverting input IN+ is coupled to a second middle point N3+ between the resistors R2 and R3. The transistor Q2, e.g., a bipolar transistor, is configured to function as a diode.

The start-up circuit 130 includes a level detector 140 and a start-up circuitry 150. The start-up circuit 130 is enabled to start-up the band-gap reference circuit 120 from a standby state (when the voltage at the output OUT of the operational amplifier OP is at a standby level) into a stable operating state (when the voltage at the output OUT of the operational amplifier OP is at the desired reference voltage level).

The level detector 140 includes a PMOS transistor Pd and an n-type metal-oxide-semiconductor (NMOS) transistor $N_L$. The gates of the PMOS transistors P1 and Pd are connected to the first node N1 so that the PMOS transistors P1 and Pd are turned ON at about the same time. The NMOS transistor $N_L$ is a long-channel device having a gate coupled to receive the power supply voltage VDD. The NMOS transistor $N_L$ is configured to be turned ON upon application of the power supply voltage VDD to the gate thereof. The level detector 140 is arranged to detect the voltage at the first node N1.

The start-up circuitry 150 includes a complementary metal-oxide-semiconductor (CMOS) transmission gate $TG_{SU}$ which has a negative control terminal connected to a node EN_L. The transmission gate $TG_{SU}$ further has a positive control terminal connected to a node EN which has an inverse logic level to that of the node EN_L due to an inverter INV. Other terminals of the transmission gate $TG_{SU}$ are coupled to the first node N1 and the second node N2, respectively.

In the standby state, the voltage at the first node N1 is at a voltage level (e.g., VDD) sufficient to turn OFF the PMOS transistor P1. For example, an enabling circuit (e.g., a transistor) is provided to keep the voltage at the first node N1 at VDD, and the band-gap reference circuit 120 in the standby state. The voltage at the second node N2 is at the ground level (e.g., VSS). Therefore, the band-gap reference circuit 120 is turned OFF and the transmission gate $TG_{SU}$ is also turned OFF.

At the beginning of the start-up phase, an enabling signal (not shown) is applied to the enabling circuit to enable the band-gap reference circuit 120 by disconnecting the first node N1 from the power supply voltage VDD, thereby permitting the voltage at the first node N1 to vary. The enabling signal also causes a low voltage to be applied to the node EN_L (and, via the inverter INV, a high voltage to be applied to the node EN). As a result, the transmission gate $TG_{SU}$ is turned ON to connect the first node N1 to the second node N2. Due to the connection between the first node N1 and the second node N2, the voltage at the first node N1 is decreased and the voltage at the second node N2 is increased. When the voltage at the first node N1 is decreased to a sufficient level, the PMOS transistor P1 is turned ON. As discussed above, at about the same time, the PMOS transistor Pd is also turned ON, causing the voltage at the node EN_L to increase (and the voltage at the node EN to decrease) and eventually turn OFF the transmission gate $TG_{SU}$. The start-up phase ends here with the band-gap reference circuit 120 starting to function by itself and the start-up circuit 130 being turned OFF.

In the subsequent operating state, the voltage at the first node N1 settles at a reference voltage level which is predetermined by the specific configuration of the components of the band-gap reference circuit 120, such as an offset voltage of the operational amplifier OP, and/or emitter-to-base junction areas of the transistors Q1 and Q2, and/or resistance values of the resistors R1-R3. Likewise, the voltage at the second node N2 settles at a desired voltage level. The voltages at the first middle point N3− and the second middle point N3+ are charged through the second node N2 and also settle at respective voltage levels.

Figure 4:
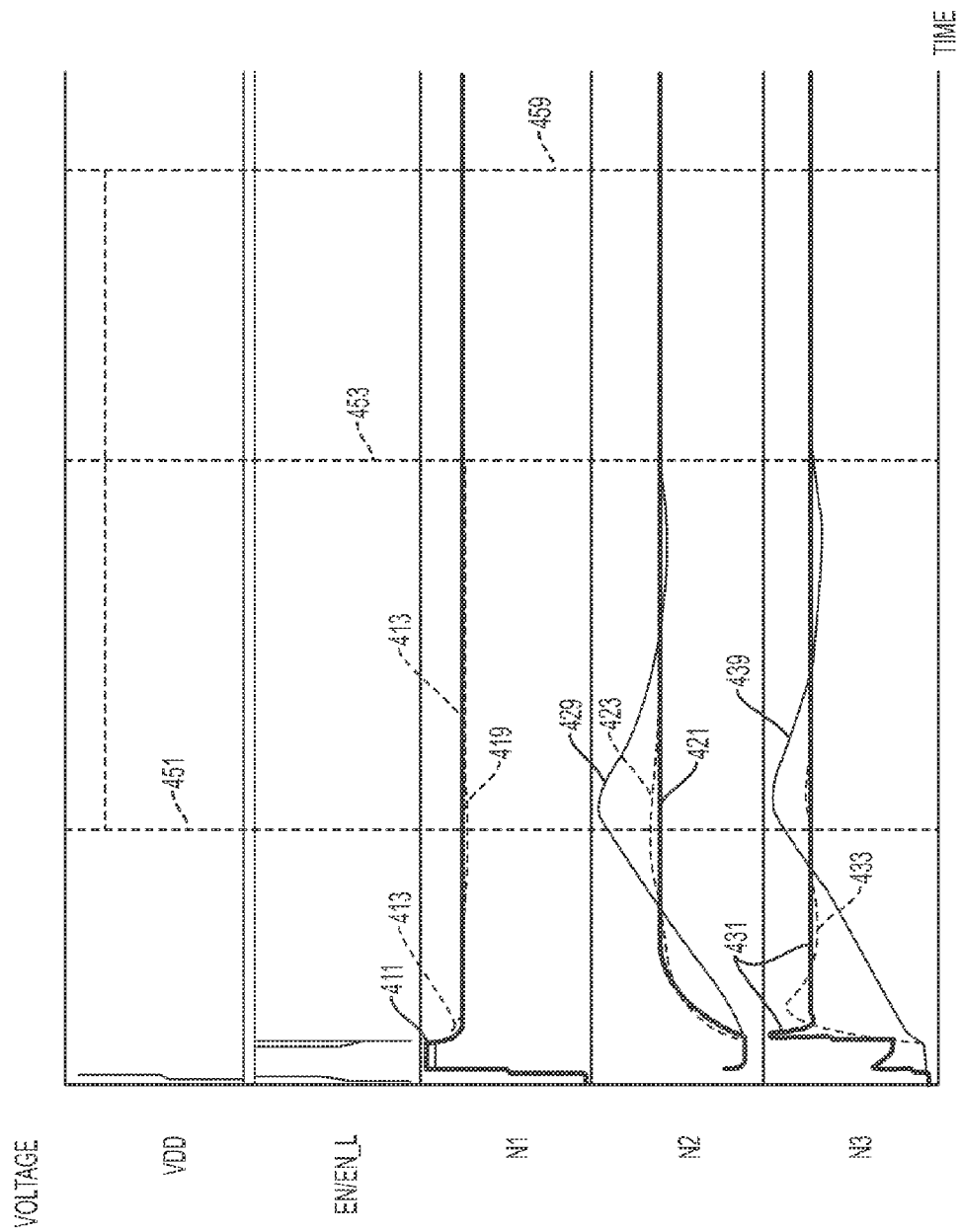
FIG. 4 includes various timing diagrams at certain nodes in the band-gap reference circuits exemplarily illustrated in FIGS. 1 and 3.

The band-gap reference circuit 120 started-up by the start-up circuit 130 generally has a short settling time under normal operational conditions. As seen in FIG. 4, the voltages at the first node N1, the second node N2 and the non-inverting input IN+ of the operational amplifier OP (second middle point N3+) settle quickly, as indicated at 411, 421, 431, respectively. In FIG. 4, the settling time of the band-gap reference circuit 120 under normal operational conditions ends at a timing 451.

However, the inventors have recognized that under certain large load operating conditions, the voltage at the second node N2 is likely to over-increase beyond the desired voltage level with a large overshot, as exemplarily indicated at 429 in FIG. 4. As a result, the settling time of the voltage(s) at the first node N1 and/or the second node N2 and/or the non-inverting input IN+ of the operational amplifier OP (second middle point N3+) becomes longer, as indicated at 419, 429, 439, respectively. In FIG. 4, the settling time of the band-gap reference circuit 120 started-up by the start-up circuit 130 under certain large load operating conditions ends at a much later timing 459.

The inventors have also recognized that similar situations, i.e., with large voltage overshots and/or slow settling times, are likely to occur when the band-gap reference circuit 120 started-up by the start-up circuit 130 is used in certain low power or wide-range power applications. The reason is believed to be that, under low power operating conditions, resistances of resistors R1-R3 are sufficiently large to permit only small currents to charge the first middle point N3− and/or second middle point N3+ which leads to a longer settling time. As a consequence, the second node N2 experiences a voltage overshot.

External circuits that use the reference voltage generated by the band-gap reference circuit 120 are likely to be affected by the longer settling time and/or the large voltage overshot. For example, external circuits, like charge pumps of flash memories, are likely to generate too high voltages, potentially causing damage to the flash memories.

In some embodiments, for improved settling time of a band-gap reference circuit comprising an operational amplifier, at least one current source is connected to at least one input of the operational amplifier during the start-up phase, and is disconnected from the at least one input of the operational amplifier after the start-up phase.

Figure 2A:
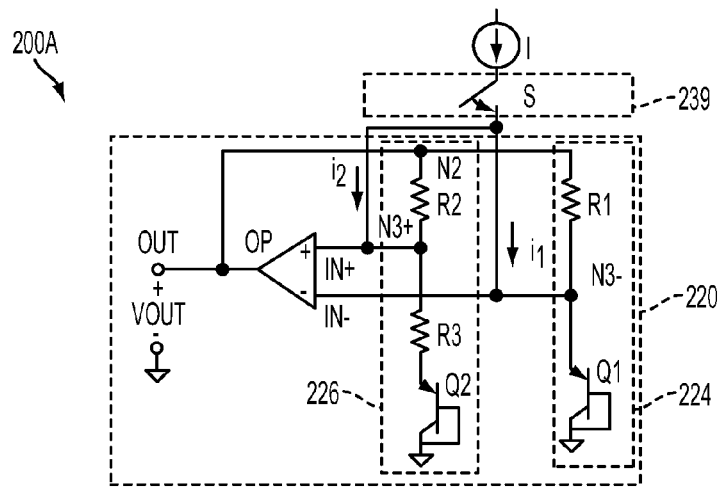
FIGS. 2A-2C are schematic circuit diagrams of various electronic circuits in accordance with some embodiments.
Figure 2B:
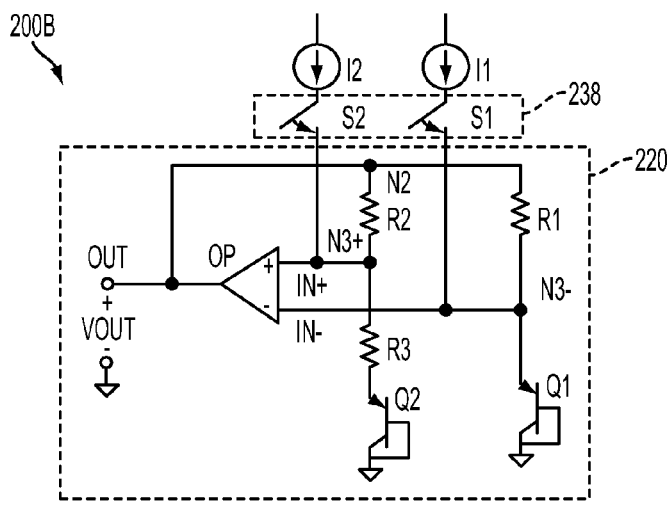
Figure 2C:
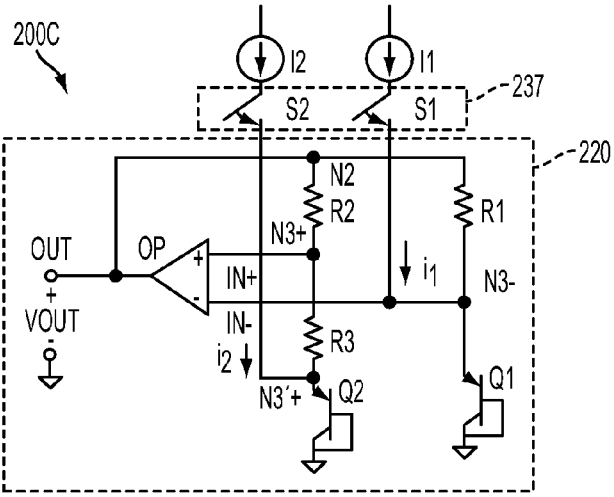

FIGS. 2A-2C are schematic circuit diagrams of various electronic circuits in accordance with some embodiments.

With reference to FIG. 2A, an electronic circuit 200A in accordance with some embodiments includes a band-gap reference circuit 220 and a start-up circuit 239.

The band-gap reference circuit 220 includes an operational amplifier OP which has an output OUT, and first and second inputs one of which is an non-inverting input IN+ whereas the other is an inverting input IN−. The band-gap reference circuit 220 is configured to generate a predetermined reference voltage Vout at the output OUT of the operational amplifier OP after a start-up phase of the band-gap reference circuit 220.

Specifically, the band-gap reference circuit 220 includes a first node being the output OUT of the operational amplifier OP, and a second node N2. The band-gap reference circuit 220 further includes first and second current paths 224, 226 between the second node N2 and the ground VSS (or a low power supply voltage). The inverting input IN− of the operational amplifier OP is coupled to the first current path 224, e.g., to a first middle point N3− in the first current path 224. The non-inverting input IN+ of the operational amplifier OP is coupled to the second current path 226, e.g., to a second middle point N3+ in the second current path 226.

In some embodiments, the first current path 224 and the second current path 226 of the band-gap reference circuit 220 include similar elements to those of the band-gap reference circuit 120, such as resistors R1-R3, diodes (or bipolar transistors) Q1, Q2, second node N2, first middle point N3− and second middle point N3+. In further embodiments, other band-gap reference circuit configurations with one or more operational amplifiers are implemented.

The start-up circuit 239 includes at least one switch S. The switch S is arranged to connect at least one current source Ito at least one of the inputs, e.g., the inverting input IN− and the non-inverting input IN+, of the operational amplifier OP during the start-up phase of the band-gap reference circuit 220. After the start-up phase, the switch S is arranged to disconnect the at least one current source I from the at least one input of the operational amplifier OP.

The switch S is arranged to connect the current source I to both the inverting input IN− and the non-inverting input IN+ of the operational amplifier OP during the start-up phase of the band-gap reference circuit 220, and to disconnect the current source I from the inputs of the operational amplifier OP thereafter. Specifically, the switch S has one end connect to the current source I, and an opposite end connected to the inverting input IN− and the non-inverting input IN+ of the operational amplifier OP, which are, in turn, connected to the first middle point N3− and the second middle point N3+, respectively.

Figure 3:
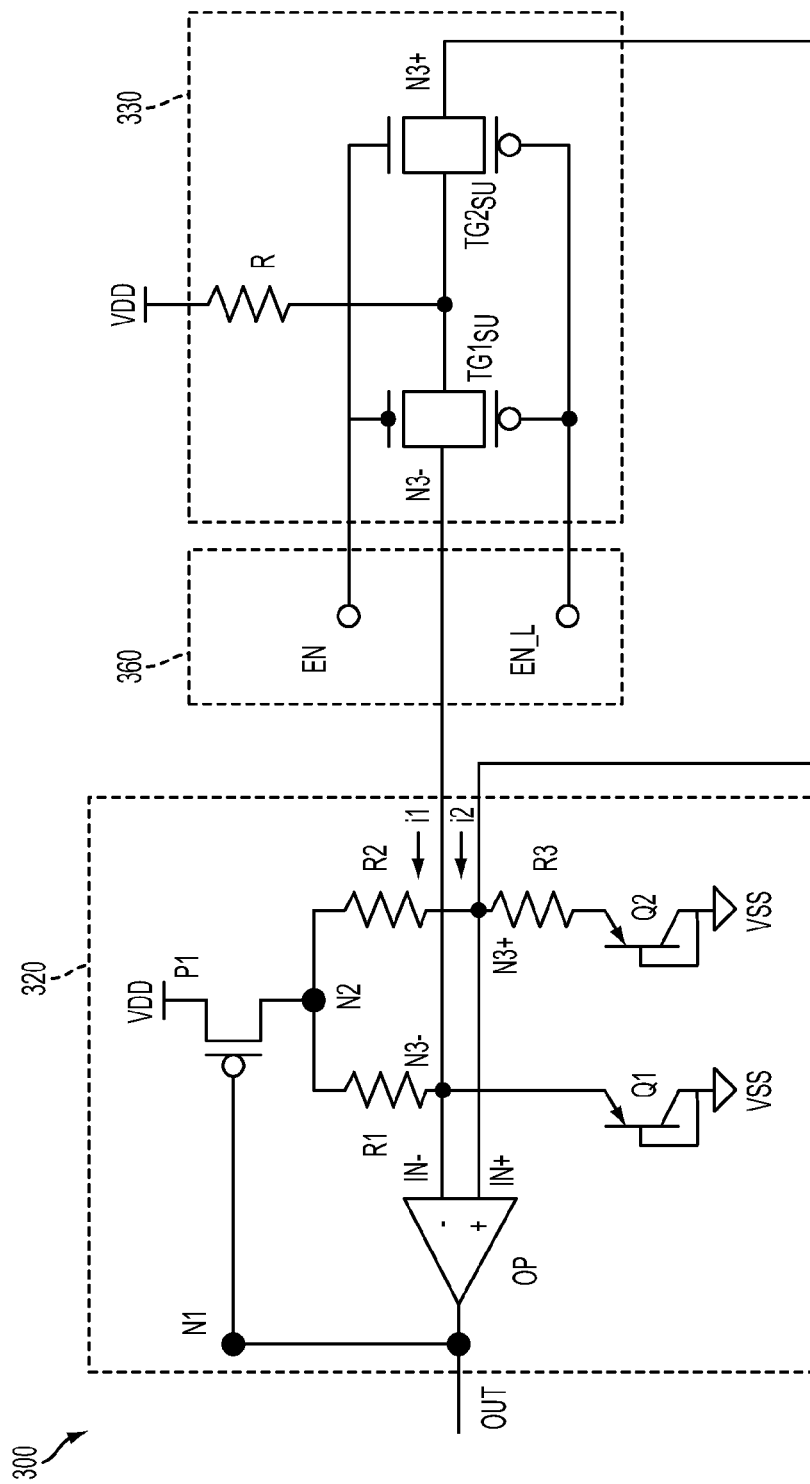
FIG. 3 is a schematic circuit diagram of an electronic circuit having a band-gap reference circuit and a start-up circuit in accordance with some embodiments.

In some embodiments, the current source I includes a power supply voltage, e.g., VDD in FIG. 3. In further embodiments, any other current sources, such as current source circuits, are implemented.

At the beginning of the start-up phase, a start-up enabling signal is applied to the switch S and causes the switch S to close. Thus, during the start-up phase, currents i1, i2 from the current source I flow through the switch S to the respective inputs of the operational amplifier OP. By connecting the switch S to middle points, e.g., the first middle point N3− and the second middle point N3+, in the first current path 224 and the second current path 226, respectively, the charging currents i1, i2 flow to the inverting input IN− and non-inverting input IN+ of the operational amplifier OP without flowing through the second node N2. As a result, the voltage at each input of the operational amplifier OP is charged to an intended voltage level faster than when it is charged via the second node N2 as in the electronic circuit 100. When the voltage Vout at the output OUT of the operational amplifier OP has reached a predetermined level, a start-up disabling signal (not shown) is applied to the switch S and causes the switch S to open, thereby disconnecting the current source I from the inputs of the operational amplifier OP. The start-up phase ends and the band-gap reference circuit 220 functions by itself.

As the voltage at each input of the operational amplifier OP is charged to an intended voltage level faster than when charged via the second node N2 as in the electronic circuit 100, a settling time of the band-gap reference circuit 220 becomes shorter and there is a lower likelihood that the voltage at the second node N2 experiences a voltage overshot.

In some embodiments, similar effects are achievable when the switch S connects the current source Ito only one of the inputs of the operational amplifier OP, e.g., via a middle point of the respective first current path 224 or second current path 226.

Although the electronic circuit 200A in accordance with embodiments disclosed with respect to FIG. 2A includes one switch S for connecting one current source Ito the input(s) of the operational amplifier OP, further embodiments with more than one switch and/or more than one current source are contemplated.

With reference to FIG. 2B, an electronic circuit 200B in accordance with some embodiments includes the band-gap reference circuit 220 and a start-up circuit 238.

The start-up circuit 238 having more than one switch, e.g., two switches S1, S2, is used, instead of the start-up circuit 239 with a single switch S, with the band-gap reference circuit 220 in the electronic circuit 200B. The switches S1, S2 are arranged to connect respective current sources I1, I2 to the respective inputs, i.e., inverting input IN− and non-inverting input IN+, of the operational amplifier OP during the start-up phase, in a manner similar to that described with respect to the electronic circuit 200A. Further, the switches S1, S2 in the electronic circuit 200B are arranged to disconnect the current sources I1, I2 from the respective inputs, i.e., inverting input IN− and non-inverting input IN+, of the operational amplifier OP after the start-up phase, in a manner similar to that described with respect to the electronic circuit 200A.

The switches S, S1, S2 include any electronic switching devices, including but not limited to, CMOS transmission gates, transistors of any type such as PMOS transistors and NMOS transistors etc.

In some embodiments, the switches S1, S2 are closed at about the same time. In further embodiments, the switches S1, S2 are configured to close at different timings depending on the application.

In some embodiments, the switches S1, S2 are connected to the same current source, rather than to two different current sources I1, I2, as will be exemplarily described in detail with respect to FIG. 3 below. In some embodiments, one or more of the current sources I1, I2 is/are one or more power supply voltages and/or one or more current sources of any types, such as current source circuits.

Similar effects to those described with respect to the electronic circuit 200A are also achievable in the electronic circuit 200B.

With reference to FIG. 2C, an electronic circuit 200C in accordance with some embodiments includes the band-gap reference circuit 220 and a start-up circuit 237.

The start-up circuit 237 is similar to the start-up circuit 238 of FIG. 2B with the switches S1, S2 respectively connected to the current sources I1, I2. A difference between the start-up circuit 237 and the start-up circuit 238 is that the switch S2 in the start-up circuit 237 is not connected to the non-inverting input IN+ of the operational amplifier OP via the second middle point N3+ between the resistors R2, R3. Instead, the switch S2 is connected to the non-inverting input IN+ of the operational amplifier via an intermediate node N3+' between the resistor R3 and the bipolar transistor Q2. The intermediate node N3+' is a middle point in the second current path 226. During the start-up phase, the charging current i2 flows from the current source I2 via the switch S2, the intermediate node N3+' and the resistor R3 to charge the non-inverting input IN+ of the operational amplifier OP, without flowing through the second node N2.

Similar effects to those described with respect to the electronic circuit 200A are also achievable in the electronic circuit 200C.

FIG. 3 is a schematic circuit diagram of an electronic circuit 300 having a band-gap reference circuit 320 and a start-up circuit 330 in accordance with some embodiments.

The band-gap reference circuit 320 is similar to the band-gap reference circuit 120 described with respect to FIG. 1, and will not be described in detail hereinafter. In further embodiments, other band-gap reference circuit configurations with one or more operational amplifiers are implemented.

The start-up circuit 330 is an exemplary implementation of the electronic circuit 200B of FIG. 2B when the switches S1, S2 are connected to the same current source. Other implementations of any embodiments disclosed herein, especially with respect to FIGS. 2A-2C, will be apparent to those of ordinary skill in the art upon reading the disclosure herein.

The start-up circuit 330 includes a first transmission gate $TG1_{SU}$ performing the function of the switch S1, and a second transmission gate $TG2_{SU}$ performing the function of the switch S2. The first transmission gate $TG1_{SU}$ and second transmission gate $TG2_{SU}$ each have a negative control terminal connected to a node EN_L and a positive control terminal connected to a node EN. Other terminals of the first transmission gate $TG1_{SU}$ are coupled to the power supply voltage VDD (i.e., a current source) via a current limiting resistor R and to the first middle point N3− of the band-gap reference circuit 320. Likewise, other terminals of the first transmission gate $TG1_{SU}$ are coupled to the power supply voltage VDD via the current limiting resistor R and to the second middle point N3+ of the band-gap reference circuit 320.

In some embodiments, the current limiting resistor R is omitted or replaced with any other current limiting structure.

In some embodiments, the first transmission gate $TG1_{SU}$ and/or the second transmission gate $TG2_{SU}$ is/are implemented by one or more CMOS transmission gates. Each CMOS transmission gate includes a PMOS transistor (not shown) and an NMOS transistor (not shown). The gates of the PMOS transistor and the NMOS transistor define the negative and positive control terminals of the CMOS transmission gate. The source of the PMOS transistor is coupled to the drain of the NMOS transistor and defines the terminal of the CMOS transmission gate that is connected to the power supply voltage VDD. The source of the NMOS transistor is coupled to the drain of the PMOS transistor and defines the terminal of the CMOS transmission gate that is connected to the respective first middle point N3− or second middle point N3+.

In further embodiments, the first transmission gate $TG1_{SU}$ and/or second transmission gate $TG2_{SU}$ is/are replaced by any other electronic switching devices, e.g., PMOS and/or NMOS transistors.

At the beginning of the start-up phase, a start-up enabling signal is provided by an enabling circuit 360 schematically illustrated in FIG. 3. In some embodiments, the enabling circuit 360 provides, as the start-up enabling signal, a logic high voltage at the node EN and a logic low voltage (e.g., an inverse of the logic high voltage) at the node EN_L. The start-up enabling signal causes the switches, i.e., first transmission gate $TG1_{SU}$ and second transmission gate $TG2_{SU}$ to close, and connect the current source, i.e., the power supply voltage VDD, to the inverting input IN− and non-inverting input IN+ of the operational amplifier OP. The charging currents i1, i2 flow to the respective inverting input IN− and non-inverting input IN+ of the operational amplifier OP, without flowing through the second node N2. In other words, the first transmission gate $TG1_{SU}$ and second transmission gate $TG2_{SU}$ define, upon application of the start-up enabling signal, respective first and second charging paths for the charging currents i1, i2 from the power supply voltage VDD to the respective inputs of the operational amplifier OP. The charging paths do not include the second node N2, i.e., the charging currents i1, i2 do not flow through the second node N2. As a result, the inverting input IN− and non-inverting input IN+ of the operational amplifier OP are quickly charged, reducing the settling time and a likelihood of voltage overshot.

After a predetermined interval, the enabling circuit 360 provides a start-up disabling signal to the start-up circuit 330. In some embodiments, the enabling circuit 360 provides, as the start-up disabling signal, a logic low voltage at the node EN and a logic high voltage at the node EN_L. The start-up disabling signal causes the switches, i.e., first transmission gate $TG1_{SU}$ and second transmission gate $TG2_{SU}$ to open, and disconnect the current source, i.e., the power supply voltage VDD, from the inverting input IN− and non-inverting input IN+ of the operational amplifier OP. The charging currents i1, i2 are discontinued. The band-gap reference circuit 320 is left to function by itself. The start-up phase is terminated.

In some embodiments, the start-up disabling signal is provided when the voltage at the output OUT of the operational amplifier OP has reached a predetermined voltage level. For this purpose, a level detector, such as the level detector 140 described with respect to FIG. 1, is used in in some embodiments.

FIG. 4 includes various timing diagrams at the node EN, first node N1, second node N2 and second middle point N3+ (non-inverting input IN+) in the band-gap reference circuits exemplarily illustrated in FIGS. 1 and 3.

As discussed above with respect to FIG. 1, under normal operational conditions, the electronic circuit 100 generally has a short settling time. The voltages at the first node N1, the second node N2 and the non-inverting input IN+ of the operational amplifier OP (second middle point N3+) settle quickly, as indicated at 411, 421, 431, respectively. The settling time ends at a timing 451.

However, under large load or low power operating conditions, the second node N2 in the electronic circuit 100 experiences a large voltage overshot, as exemplarily indicated at 429 in FIG. 4. The voltages at the first node N1 and/or the second node N2 and/or the non-inverting input IN+ of the operational amplifier OP (second middle point N3+) take longer to settle, as indicated at 419, 429, 439, respectively.

The settling time of the electronic circuit 100 under large load or low power operating conditions ends at a much later timing 459.

In contrast, even under similar large load or low power operating conditions, the electronic circuit 300 significantly reduces or even eliminates a voltage overshot at the second node N2, as exemplarily indicated at 423 in FIG. 4. The voltages at the first node N1, the second node N2 and the non-inverting input IN+ of the operational amplifier OP (second middle point N3+) settle faster than in the electronic circuit 100, as indicated at 413, 423, 433, respectively. The settling time of the electronic circuit 300, even under large load or low power operating conditions, ends at an earlier timing 453 than that (timing 459) of the electronic circuit 100 under similar large load or low power operating conditions.

Figure 5:
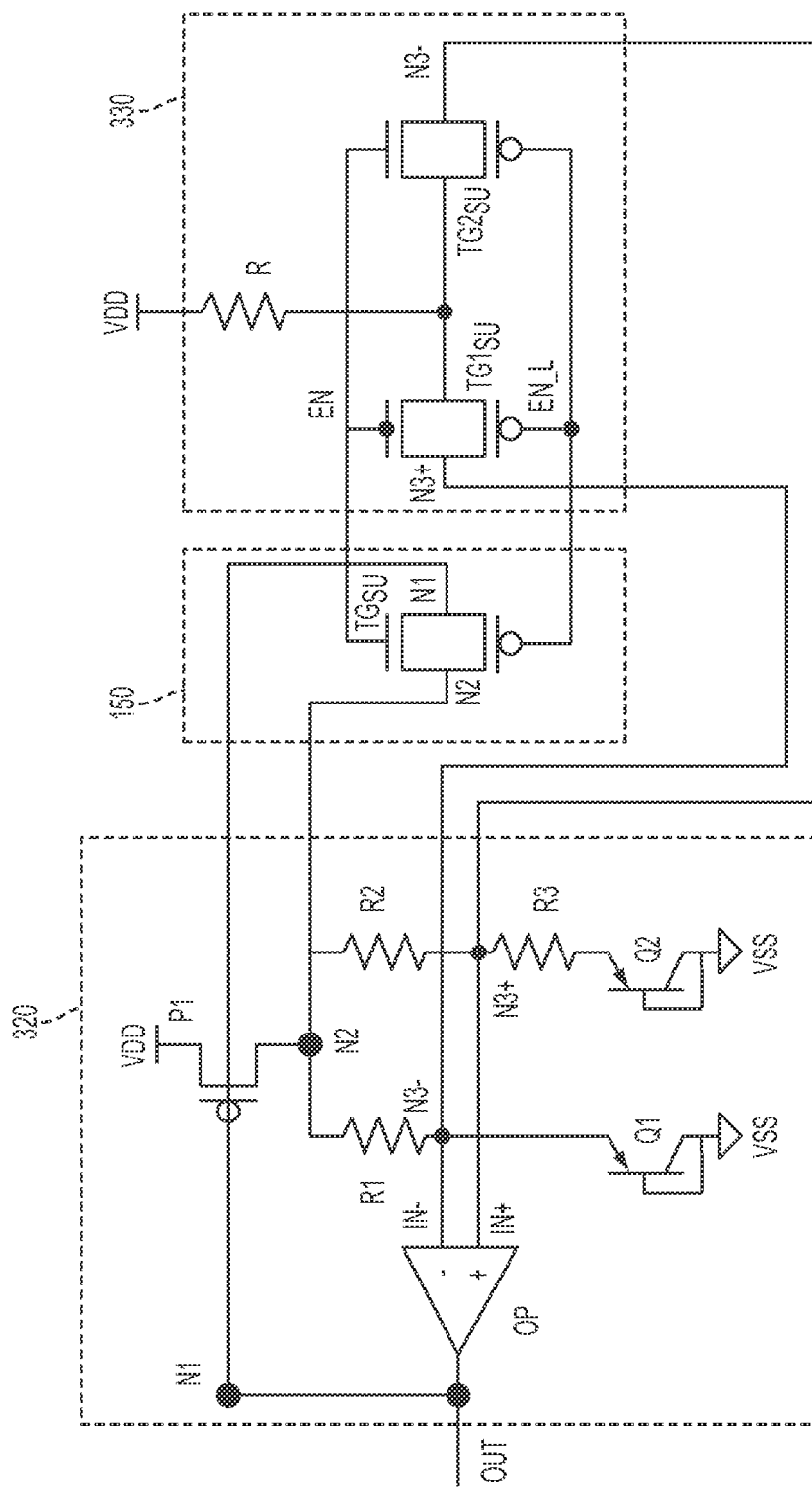
FIG. 5 is a schematic circuit diagram of an electronic circuit having a band-gap reference circuit and a start-up circuit in accordance with some embodiments.

FIG. 5 is a schematic circuit diagram of an electronic circuit 500 in accordance with some embodiments.

The electronic circuit 500 includes a band-gap reference circuit 320 as described with respect to FIG. 3, a start-up circuit 330 as described with respect to FIG. 3, and a start-up circuitry 150 as described with respect to FIG. 1. Effects similar to those described with respect to FIG. 1 and/or FIG. 3 are achievable in the electronic circuit 500.

In one or more embodiments, a band-gap reference circuit, which includes an operational amplifier, e.g., any band-gap reference circuit described with respect to FIGS. 2A-2C and 3, is started-up by a method in which, during the start-up phase, at least one current source, e.g., any of the current sources I, I1, I2 described with respect to FIGS. 2A-2C, is connected to at least one of the inputs of the operational amplifier, e.g., the inverting input IN− and/or the non-inverting input IN+ of the operational amplifier OP described with respect to FIGS. 2A-2C and 3. After the start-up phase, the at least one current source I, I1, I2 is disconnected from the at least one input IN− and/or IN+ of the operational amplifier OP.

In such a method, charging currents, e.g., i1, i2 described with respect to FIGS. 2A-2C and 3, flow from the at least one current source I, I1, I2 to the at least one input IN+ and/or IN− of the operational amplifier OP without flowing through the second node N2 of the band-gap reference circuit. Effects similar to those described with respect to FIGS. 2A-2C and 3 are achievable by the starting-up method.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

According to some embodiments, a circuit includes a band-gap reference circuit and a start-up circuit. The band-gap reference circuit includes an operational amplifier having an output, a first input, and a second input, a first current path between a power supply node and a reference node, a second current path between the power supply node and the reference node, and a feedback path between the output of the operational amplifier and the first and second current paths. The first input of the operational amplifier is coupled to said first current path, and the second input of the operational amplifier is coupled to said second current path. The start-up circuit includes a current source and at least one switch coupled between the current source and the band-gap reference circuit. The at least one switch is configured to electrically couple the current source with the first and second current paths during a start-up phase, and to electrically decouple the current source from the first and second current paths after the start-up phase.

According to some embodiments, a circuit includes a band-gap reference circuit and a start-up circuit. The band-gap reference circuit includes an operational amplifier having an output, a first input, and a second input, a first current path between a power supply node and a reference node, a second current path between the power supply node and the reference node, and a feedback path between the output of the operational amplifier and the first and second current paths. The first input of the operational amplifier is coupled to the first current path, and the second input of the operational amplifier is coupled to the second current path. The start-up circuit includes a first current source, as second current source, a first switch, and a second switch. The first switch is coupled between the first current source and the first current path. The first switch is configured to electrically couple the first current source with the first current path during a start-up phase, and to electrically decouple the first current source from the first current path after the start-up phase. The second switch is coupled between the second current source and the second current path. The second switch is configured to electrically couple the second current source with the second current path during the start-up phase, and to electrically decouple the second current source from the second current path after the start-up phase.

According to some embodiments, a method of starting-up a band-gap reference circuit includes, during a start-up phase, electrically coupling a first current path and a second current path of the band-gap reference circuit jointly to one or more current sources or separately to two corresponding current sources of the one or more current sources. The first current path is between a power supply node and a reference node, and the second current path is between the power supply node and the reference node. The band-gap reference circuit further includes an operational amplifier. The operational amplifier has an output, a first input coupled to the first current path, and a second input coupled to the second current path. After the start-up phase, the first and second current paths are electrically decoupled from the one or more current sources.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A circuit, comprising:
  a band-gap reference circuit comprising:
    an operational amplifier having an output, a first input, and a second input;
    a first current path between a power supply node and a reference node, the first input of the operational amplifier being coupled to the first current path;
    a second current path between the power supply node and the reference node, the second input of the operational amplifier being coupled to the second current path; and
    a feedback path between the output of the operational amplifier and the first current path and the second current path; and
  a start-up circuit comprising:
    a current source; and
    at least one switch coupled between the current source and the band-gap reference circuit, the at least one switch being configured to electrically couple the current source with the first current path and the second current path during a start-up phase, and to electrically decouple the current source from the first current path and the second current path after the start-up phase.

2. The circuit of claim 1, wherein the at least one switch includes a switch having a first end coupled with the current source and a second end coupled with the first input and the second input of the operational amplifier.

3. The circuit of claim 1, wherein the at least one switch comprises:
  a first switch having a first end coupled with the current source and a second end coupled with the first input of the operational amplifier; and
  a second switch having a first end coupled with the current source and a second end coupled with the second input of the operational amplifier.

4. The circuit of claim 1, wherein
  the first current path comprises a first resistive element and a first transistor coupled in series, the first input of the operational amplifier being between the first resistive element and the first transistor; and
  the second current path comprises a second resistive element and a second transistor coupled in series, the second input of the operational amplifier being between the second resistive element and the second transistor.

5. The circuit of claim 4, wherein
  the first resistive element is coupled between a common node and the first input of the operational amplifier;
  the first transistor is coupled between the first input of the operational amplifier and the reference node;
  the second resistive element is coupled between the common node and the second input of the operational amplifier; and
  the second transistor is coupled between the second input of the operational amplifier and the reference node.

6. The circuit of claim 5, wherein the second current path further comprises a third resistive element between the second resistive element and the second transistor.

7. The circuit of claim 5, wherein the feedback path includes a third transistor between the power supply node and the common node, and a gate terminal of the third transistor is coupled with the output of the operational amplifier.

8. The circuit of claim 7, further comprising another switch coupled between the gate terminal of the third transistor and the common node, the another switch being configured to electrically couple the gate terminal of the third transistor with the common node during the start-up phase, and to electrically decouple the gate terminal of the third transistor from the common node after the start-up phase.

9. A circuit, comprising:
  a band-gap reference circuit comprising:
    an operational amplifier having an output, a first input, and a second input;
    a first current path between a power supply node and a reference node, the first input of the operational amplifier being coupled to the first current path;
    a second current path between the power supply node and the reference node, the second input of the operational amplifier being coupled to the second current path; and
    a feedback path between the output of the operational amplifier and the first current path and the second current path; and a start-up circuit comprising:
  a first current source;
  a second current source;
  a first switch coupled between the first current source and the first current path, the first switch being configured to electrically couple the first current source with the first current path during a start-up phase, and to electrically decouple the first current source from the first current path after the start-up phase; and
  a second switch coupled between the second current source and the second current path, the second switch being configured to electrically couple the second current source with the second current path during the start-up phase, and to electrically decouple the second current source from the second current path after the start-up phase.

10. The circuit of claim 9, wherein
the first switch comprises a first end coupled with the first current source and a second end coupled with the first input of the operational amplifier; and
the second switch comprises a first end coupled with the second current source and a second end coupled with the second input of the operational amplifier.

11. The circuit of claim 9, wherein
the first current path comprises a first resistive element and a first transistor coupled in series, the first input of the operational amplifier being between the first resistive element and the first transistor; and
the second current path comprises a second resistive element and a second transistor coupled in series, the second input of the operational amplifier being between the second resistive element and the second transistor.

12. The circuit of claim 11, wherein
the first switch comprises a first end coupled with the first current source and a second end coupled with the first input of the operational amplifier; and
the second switch comprises a first end coupled with the second current source and a second end coupled with the second input of the operational amplifier.

13. The circuit of claim 11, wherein
the first switch comprises a first end coupled with the first current source and a second end coupled with the first transistor; and
the second switch comprises a first end coupled with the second current source and a second end coupled with the second transistor.

14. The circuit of claim 11, wherein
the first resistive element is coupled between a common node and the first input of the operational amplifier;
the first transistor is coupled between the first input of the operational amplifier and the reference node;
the second resistive element is coupled between the common node and the second input of the operational amplifier; and
the second transistor is coupled between the second input of the operational amplifier and the reference node.

15. The circuit of claim 14, wherein the second current path further comprises a third resistive element between the second resistive element and the second transistor.

16. The circuit of claim 14, wherein the feedback path includes a third transistor between the power supply node and the common node, and a gate terminal of the third transistor is coupled with the output of the operational amplifier.

17. The circuit of claim 16, further comprising another switch coupled between the gate terminal of the third transistor and the common node, the another switch being configured to electrically couple the gate terminal of the third transistor with the common node during the start-up phase, and to electrically decouple the gate terminal of the third transistor from the common node after the start-up phase.

18. A method of starting-up a band-gap reference circuit, the method comprising:
during a start-up phase, electrically coupling a first current path and a second current path of the band-gap reference circuit jointly to one or more current sources through at least one switch or separately to two corresponding current sources of the one or more current sources through the at least one switch, the first current path being between a power supply node and a reference node, the second current path being between the power supply node and the reference node, and the band-gap reference circuit further comprising an operational amplifier, the operational amplifier having an output, a first input coupled to the first current path, and a second input coupled to the second current path; and
after the start-up phase, electrically decoupling the first current path and the second current path from the one or more current sources through the at least one switch.

19. The method of claim 18, wherein the electrically coupling the first current path and the second current path of the band-gap reference circuit jointly to the one or more current sources through the at least one switch or separately to the two corresponding current sources of the one or more current sources through the least one switch comprises turning on the at least one switch, the at least one switch comprising a first end coupled to the one or more current sources and a second end coupled to the first current path and the second current path.

20. The method of claim 18, wherein
the at least one switch comprises a first switch and a second switch; and
the electrically coupling the first current path and the second current path of the band-gap reference circuit jointly to the one or more current sources through the least one switch or separately to the two corresponding current sources of the one or more current sources through the least one switch comprises:
turning on the first switch, the first switch comprising a first end coupled to a first one of the two current sources and a second end coupled to the first current path; and
turning the second switch, the second switch comprising a first end coupled to a second one of the two current sources and a second end coupled to the second current path.

* * * * *